US009362126B2

(12) United States Patent
Ganesan et al.

(10) Patent No.: US 9,362,126 B2
(45) Date of Patent: Jun. 7, 2016

(54) PROCESS FOR MAKING A PATTERNED METAL OXIDE STRUCTURE

(71) Applicant: AGENCY FOR SCIENCE, TECHNOLOGY AND RESEARCH, Singapore (SG)

(72) Inventors: Ramakrishnan Ganesan, Singapore (SG); Jarrett Dumond, Singapore (SG); M. S. M. Saifullah, Singapore (SG); Su Hui Lim, Singapore (SG); Hazrat Hussain, Singapore (SG); Hong Yee Low, Singapore (SG)

(73) Assignee: AGENCY FOR SCIENCE, TECHNOLOGY AND RESEARCH, Singapore (SG)

(*) Notice: Subject to any disclaimer, the term of this patent is extended or adjusted under 35 U.S.C. 154(b) by 315 days.

(21) Appl. No.: 13/625,400

(22) Filed: Sep. 24, 2012

(65) Prior Publication Data
US 2013/0078796 A1 Mar. 28, 2013

(30) Foreign Application Priority Data
Sep. 22, 2011 (SG) .................. 2011068590

(51) Int. Cl.
*G03F 7/00* (2006.01)
*H01L 21/283* (2006.01)
(Continued)

(52) U.S. Cl.
CPC ............ *H01L 21/283* (2013.01); *B81C 1/0046* (2013.01); *B82Y 10/00* (2013.01);
(Continued)

(58) Field of Classification Search
CPC .................. B29C 35/0888; B29C 2035/0827; B29C 2059/023; Y10S 977/887
See application file for complete search history.

(56) References Cited

U.S. PATENT DOCUMENTS 7,750,059 B2 * 7/2010 Jung et al. .................. 522/6
2004/0141168 A1 * 7/2004 Sreenivasan et al. ........... 355/75
(Continued)

FOREIGN PATENT DOCUMENTS

EP        1160625        5/2001
JP     2011246466     * 12/2011

OTHER PUBLICATIONS

Lim, S.H., et al., Direct imprinting of high resolution TiO2 nanostructures, Nanotechnology, vol. 21 (2010), pp. 1-6.*
(Continued)

Primary Examiner — Matthew Daniels
(74) Attorney, Agent, or Firm — Conley Rose, P.C.

(57) ABSTRACT

There is provided a process for making a patterned metal oxide structure comprising the step of heating an imprint structure comprising a polymerized organometallic compound to remove organic material and thereby form the patterned metal oxide structure, wherein the imprint structure is formed by polymerizing a resist mixture comprising at least one olefinic polymerizable compound and a polymerizable organometallic compound having, e.g., at least one carboxylate of Formula 1:

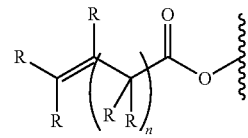

Formula 1 wherein
n is 1-12; and
each R is independently selected from the group consisting of hydrogen, alkyl, alkenyl, alkynyl, cycloakyl, cycloakenyl, aryl, and aralkyl.

18 Claims, 6 Drawing Sheets

(51) Int. Cl.
  *C23C 18/04* (2006.01)
  *C23C 18/06* (2006.01)
  *C23C 18/12* (2006.01)
  *B81C 1/00* (2006.01)
  *B82Y 40/00* (2011.01)
  *G03F 7/004* (2006.01)
  *G03F 7/027* (2006.01)
  *B82Y 10/00* (2011.01)
  *H01L 29/06* (2006.01)

(52) U.S. Cl.
  CPC ............ *B82Y 40/00* (2013.01); *C23C 18/04* (2013.01); *C23C 18/06* (2013.01); *C23C 18/1216* (2013.01); *G03F 7/0002* (2013.01); *G03F 7/0043* (2013.01); *G03F 7/027* (2013.01); *B81C 2201/0152* (2013.01); *H01L 29/0676* (2013.01)

(56) References Cited

U.S. PATENT DOCUMENTS

| | | | | |
|---|---|---|---|---|
| 2008/0022896 A1* | 1/2008 | Karkkainen | ......... | C01G 23/053 106/285 |
| 2011/0031658 A1* | 2/2011 | Saifullah | ............. | B29C 43/021 264/496 |
| 2015/0322286 A1* | 11/2015 | Cabrini | ............... | G03F 7/0002 428/195.1 |

OTHER PUBLICATIONS

Segawa, H., et al, Fabrication of TiO2-Organic Hybrid Dot Arrays Using Nanosecond Laser Interference Lithography, J. Am. Ceram. Soc., vol. 89, No. 11 (2006) pp. 3507-3510.*
Mendez-Vivar, J., et al., The Role of 2-(Methacryloyloxy) Ethyl Acetoacetate in the Polymerization of Hybrid Multicomponent (Si, Ti, Zr) Sols, Journal of Sol-Gel Science and Technology, vol. 25 (2002), pp. 249-254.Ganesan.*
Ganesan, R., et al., Direct nanoimprint lithography of Al2O3 using a chelated monomer-based precursor, Nanotechnology, vol. 23 (2012), pp. 1-9.*
Imai, N. and H. Uchida, English Translation of JP2011246466, Organometal Complex Compound, Production method of Organometallic Complex Compound, and Photocuring Composition Containing Organometal Complex Compound, Dec. 8, 2011, 2 pages.*
International Preliminary Report on Patentability in PCT/US2013/072109, Issued Jun. 2, 2015, 10 pages.*
Written Opinion and Search Report for Singapore application SG201207073-6 dated Aug. 15, 2013 (25 pages).
Ganesan, R., et al., Direct nanoimprinting of metal oxides by in situ thermal co-polymerization of their methacrylates, J. Mater. Chem. 2011, 21, 4484-4492 (9 pages).
Wilson C. G., et al., Materials for step and flash imprint lithography, J. Mater. Chem. 2007, 17, 3575-3580 (97pages).
Lim S. H., et al., Direct imprinting of high resolution TiO2 nanostructures, Nanotchnology 21, 2010, 285303 (6 pages).

* cited by examiner

PROCESS FOR MAKING A PATTERNED METAL OXIDE STRUCTURE

TECHNICAL FIELD

The present invention generally relates to a process for making a patterned metal oxide structure.

BACKGROUND

Optical lithography has been established as a cost-effective method for developing nanopatterns with feature dimensions of more than 100 nm. Such processes for developing nanostructures are also commonly termed nanoimprint lithography. Alternative methods for controlled patterning in the nanoscale range (in particular less than 100 nm) are generally inefficient and cost ineffective. These methods (e.g. electron beam lithography) require large initial capital outlays and have low throughput rates. This is especially true for the writing of dense patterns over substrates with relatively larger areas. While conventional lithography methods (e.g. photolithography) can be relied upon for low-cost fabrication of imprint molds for patterns with dimensions greater than the nanoscale range (in particular more than 100 nm), molds possessing nanofeatures require at the same time, the use of relatively expensive methods.

In general, nanoimprint lithography involves a top-down lithographic method for the development of nanostructures. The method can be employed to generate patterns with resolutions far superior to conventional lithographic techniques. Commonly, nanoimprint lithography methods can be classified into three main categories, namely, thermoplastic, photo nanoimprint lithography, and electrochemical nanoimprinting methods.

The nanoimprinting lithography technique has found popularity as an alternative means of creating nanopatterns, compared to conventional lithography means. Some of these disadvantages inherent in the latter include the need to replace costly consumables, high error rates and the limitation to approximately a 1 to 1 replication of the desired patterns.

While well-defined, functional metal oxide nanostructures developed through the lithography process are much desired in view of their large potential in commercial applications, many technical difficulties have been apparent in the pursuit of highly efficient and reliable methods of developing such metal oxide features. For example, in cases where chemical formulations comprising different forms of acrylates have been considered, the stability of the formulation is generally poor, due to the tendency for some of the components to experience early, undesired polymerization in the lithographic process.

Accordingly, there is a need to provide suitable lithographic processes which will provide the efficient and cost-effective development of functional metal oxide nanoparticles by overcoming or at least ameliorating the technical difficulties and disadvantages described above.

SUMMARY

According to a first aspect, there is provided a process for making a patterned metal oxide structure comprising the step of heating an imprint structure comprising a polymerized organometallic compound to remove organic material and thereby form said patterned metal oxide structure, wherein the imprint structure is formed by polymerizing a resist mixture comprising at least one olefinic polymerizable compound and a polymerizable organometallic compound having at least one carboxylate of Formula 1:

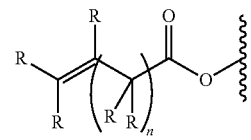

Formula 1 wherein n is 1-12; and each R is independently selected from the group consisting of hydrogen, alkyl, alkenyl, alkynyl, cycloalkyl, cycloakenyl, aryl, and aralkyl; or at least one acetoacetate of Formula 2:

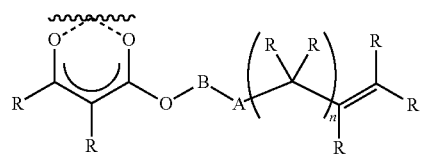

Formula 2 wherein m is 0-12; n is 0-12; A is —(C=O)— or a bond; B is —(CR$_2$)$_m$O—, —(CR$_2$CR$_2$O)$_m$—, or a bond; and each R is independently selected from the group consisting of hydrogen, alkyl, alkenyl, alkynyl, cycloalkyl, cycloakenyl, aryl, and aralkyl.

According to a second aspect, there is provided a process for making a patterned metal oxide structure comprising the steps of:
(a) polymerizing a resist mixture, while in contact with a mold having imprint forming patterns thereon, to thereby form an imprint structure comprising the polymerized organometallic compound, said resist mixture comprising at least one olefinic polymerizable compound and a polymerizable organometallic compound having at least one carboxylate of Formula 1:

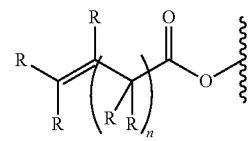

Formula 1 wherein n is 1-12; and each R is independently selected from the group consisting of hydrogen, alkyl, alkenyl, alkynyl, cycloalkyl, cycloakenyl, aryl, and aralkyl; or at least one acetoacetate of Formula 2:

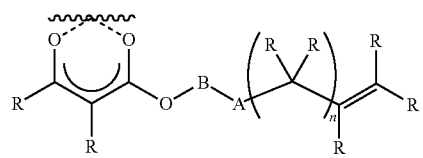

Formula 2 wherein m is 0-12; n is 0-12; A is —(C=O)— or a bond; B is —(CR$_2$)$_m$O—, —(CR$_2$CR$_2$O)$_m$—, or a bond; and each R is independently selected from the group consisting of hydrogen, alkyl, alkenyl, alkynyl, cycloalkyl, cycloakenyl, aryl, and aralkyl; and (b) eating said imprint structure to remove organic material and thereby form said patterned metal oxide structure.

According to a third aspect, there is provided a process for forming a plurality of patterned metal oxide structures comprises in the steps of:

(a) polymerizing a resist mixture, while in contact with a mold having imprint forming patterns thereon, to thereby form an imprint structure comprising the polymerized organometallic compound on a first area of a substrate, said resist mixture comprising at least one olefinic polymerizable compound and a polymerizable organometallic compound having at least one carboxylate of Formula 1:

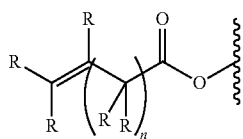

Formula 1 wherein
n is 1-12; and
each R is independently from the group consisting of hydrogen, alkyl, alkenyl, alkynyl, cycloalkyl, cycloakenyl, aryl, and aralkyl; or at least one acetoacetate of Formula 2:

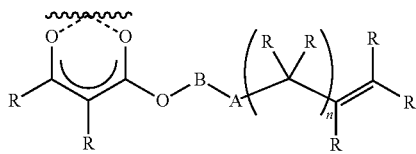

Formula 2 wherein
m is 0-12;
n is 0-12;
A is —(C=O)— or a bond; B is —(CR$_2$)$_m$O—, —(CR$_2$CR$_2$O)$_m$—, or a bond; and each R is independently selected from the group consisting of hydrogen, alkyl, alkenyl, alkynyl, cycloalkyl, cycloakenyl, aryl, and aralkyl;

(b) heating said imprint structure on said first area to remove organic material and thereby form said patterned metal oxide structure on said first area; and (c) repeating steps (a) and (b) on a second area of said substrate in order to form said plurality of patterned metal oxide structures throughout the substrate.

DEFINITIONS

The following words and terms used herein shall have the meaning indicated:

The term "nanoimprinting" is to be interpreted broadly to include any method for printing or creating a pattern or structure on the microscale and/or nanoscale size range on the surface of a substrate by contacting a mold with the defined pattern or structure on the surface at certain temperatures and pressures.

The term "imprint" and grammatical variations thereof, in the context of this specification, is intended to cover any form of physical structure that has been made by a mold. Typically, an imprint is a generally elongate structure that extends from the surface of a substrate along a longitudinal axis extending between a proximal end disposed on or adjacent to the substrate and a distal end opposite to the proximal end. Typically, the longitudinal axis is generally normal relative to a planar axis of the substrate although the longitudinal axis may be generally parallel relative to a planar axis of the substrate or may be varied significantly such as at an angle of 45° from a planar axis of the substrate. In an array of imprints that have been orderly formed as a series of rows and columns on a substrate, trenches may be formed between the adjacent rows. The imprint may be in the nanoscale or micro-scale size range both in their length dimension and thickness dimension, and hence the trenches may also be in the nanoscale or microscale size range.

The terms "micro-sized", "microscale" or the like are to be interpreted to include any dimensions that are in the range of about 1 (μm) to about 100 μm. The term "microstructures" as used herein, refers to imprint structures comprising "micro-sized" or "microscale" features.

The terms "nano-sized", "nanoscale" or the like are to be interpreted to include any dimensions that are below about 1 μm. The term "nanostructures" as used herein, are imprint structures comprising "nano-sized" or "nanoscale" or "sub-micron" features.

The term "spin-coating" as used herein generally refers to a process wherein a polymer solution is dispersed on a surface (e.g., a mold) and the surface is rapidly spun centrifugally forcing the solution to spread out and forming a thin layer of de-solvated polymer in the process.

As used herein, the term "alkyl group" includes within its meaning monovalent ("alkyl") and divalent ("alkylene") straight chain or branched chain saturated aliphatic groups having from 1 to 10 carbon atoms, eg, 1, 2, 3, 4, 5, 6, 7, 8, 9, or 10 carbon atoms. For example, the term alkyl includes, but is not limited to, methyl, ethyl, 1-propyl, isopropyl, 1-butyl, 2-butyl, isobutyl, tert-butyl, amyl, 1,2-dimethylpropyl, 1,1-dimethylpropyl, pentyl, isopentyl, hexyl, 4-methylpentyl, 1-methylpentyl, 2-methylpentyl, 3-methylpentyl, 2,2-dimethylbutyl, 3,3-dimethylbutyl, 1,2-dimethylbutyl, 1,3-dimethylbutyl, 1,2,2-trimethylpropyl, 1,1,2-trimethylpropyl, 2-ethylpentyl, 3-ethylpentyl, heptyl, 1-methylhexyl, 2,2-dimethylpentyl, 3,3-dimethylpentyl, 4,4-dimethylpentyl, 1,2-dimethylpentyl, 1,3-dimethylpentyl, 1,4-dimethylpentyl, 1,2,3-trimethylbutyl, 1,1,2-trimethylbutyl, 1,1,3-trimethylbutyl, 5-methylheptyl, 1-methylheptyl, octyl, nonyl, decyl, and the like.

The term "alkenyl group" includes within its meaning monovalent ("alkenyl") and divalent ("alkenylene") straight or branched chain unsaturated aliphatic hydrocarbon groups having from 2 to 10 carbon atoms, eg, 2, 3, 4, 5, 6, 7, 8, 9, or 10 carbon atoms and having at least one double bond, of either E, Z, cis or trans stereochemistry where applicable, anywhere in the alkyl chain. Examples of alkenyl groups include but are not limited to ethenyl, vinyl, allyl, 1-methylvinyl, 1-propenyl, 2-propenyl, 2-methyl-1-propenyl, 2-methyl-3-propenyl, 1-butenyl, 2-butenyl, 3-butenyl, 1,3-butadienyl, 1-pentenyl, 2-pentenyl, 3-pentenyl, 4-pentenyl, 1,3-pentadienyl, 2,4-pentadienyl, 1,4-pentadienyl, 3-methyl-2-butenyl, 1-hexenyl, 2-hexenyl, 3-hexenyl, 1,3-hexadienyl, 1,4-hexadienyl, 2-methylpentenyl, 1-heptenyl, 2-heptenyl, 3-heptenyl, 1-octenyl, 1-nonenyl, 1-decenyl, and the like.

The term "alkynyl group" as used herein includes within its meaning monovalent ("alkynyl") and divalent ("alkynylene") straight or branched chain unsaturated aliphatic hydrocarbon groups having from 2 to 10 carbon atoms and having at least one triple bond anywhere in the carbon chain. Examples of alkynyl groups include but are not limited to ethynyl, 1-propynyl, 1-butynyl, 2-butynyl, 1-methyl-2-butynyl, 3-methyl-1-butynyl, 1-pentynyl, 1-hexynyl, methylpentynyl, 1-heptynyl, 2-heptynyl, octynyl, 2-octynyl, 1-nonyl, 1-decynyl, and the like.

The term "cycloalkyl" as used herein refers to cyclic saturated aliphatic groups and includes within its meaning monovalent ("cycloalkyl"), and divalent ("cycloalkylene"), saturated, monocyclic, bicyclic, polycyclic or fused polycyclic hydrocarbon radicals having from 3 to 10 carbon atoms, eg, 3, 4, 5, 6, 7, 8, 9, or 10 carbon atoms. Examples of cycloalkyl groups include but are not limited to cyclopropyl, methylcyclopropyl, cyclobutyl, cyclopentyl, 2-methylcyclopentyl, 3-methylcyclopentyl, cyclohexyl, and the like.

The term "aromatic group", or variants such as "aryl" or "arylene" as used herein refers to monovalent ("aryl") and divalent ("arylene") single, polynuclear, conjugated and fused residues of aromatic hydrocarbons having from 6 to 10 carbon atoms. Examples of such groups include phenyl, biphenyl, naphthyl, phenanthrenyl, and the like.

The term "aralkyl" as used herein, includes within its meaning monovalent ("aryl") and divalent ("arylene"), single, polynuclear, conjugated and fused aromatic hydrocarbon radicals attached to divalent, saturated, straight and branched chain alkylene radicals.

The term "optionally substituted" as used herein means the group to which this term refers may be unsubstituted, or may be substituted with one or more groups independently selected from alkyl, alkenyl, alkynyl, thioalkyl, cycloalkyl, cycloalkenyl, heterocycloalkyl, halo, carboxyl, haloalkyl, haloalkynyl, hydroxyl, alkoxy, thioalkoxy, alkenyloxy, haloalkoxy, haloalkenyloxy, nitro, amino, nitroalkyl, nitroalkenyl, nitroalkynyl, nitroheterocyclyl, alkylamino, dialkylamino, alkenylamine, alkynylamino, acyl, alkenoyl, alkynoyl, acylamino, diacylamino, acyloxy, alkylsulfonyloxy, heterhocycloxy, heterocycloamino, haloheterocyloalkyl alkylsulfenyl, alkylcarbonyloxy, alkylthio, acylthio, phosphorus-containing groups such as phosphono and phosphinyl, aryl, heteroaryl, alkylaryl, alkylheteroaryl, cyano, cyanate, isocyanate, C(O)NH(alkyl), and —C(O)N(alkyl)$_2$.

The word "substantially" does not exclude "completely" e.g. a composition which is "substantially free" from Y may be completely free from Y. Where necessary, the word "substantially" may be omitted from the definition of the invention.

Unless specified otherwise, the terms "comprising" and "comprise", and grammatical variants thereof, are intended to represent "open" or "inclusive" language such that they include recited elements but also permit inclusion of additional, unrecited elements.

As used herein, the term "about", in the context of concentrations of components of the formulation, typically means +/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

DISCLOSURE OF OPTIONAL EMBODIMENTS

Exemplary, non-limiting embodiments of a process for making a patterned metal oxide structure will now be disclosed.

In one aspect, the process may comprise the step of heating an imprint structure comprising a polymerized organometallic compound to remove organic material and thereby form said patterned metal oxide structure, wherein the imprint structure is formed by polymerizing a resist mixture comprising at least one olefinic polymerizable compound and a polymerizable organometallic compound having at least one carboxylate of Formula 1:

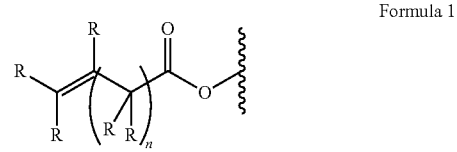

Formula 1 wherein n is 1-12; and each R is independently selected from the group consisting of hydrogen, alkyl, alkenyl, alkynyl, cycloakyl, cycloakenyl, aryl, and aralkyl; or at least one acetoacetate of Formula 2:

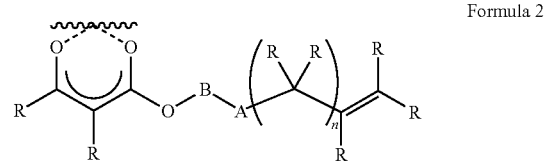

Formula 2 wherein m is 0-12; n is 0-12; A is —(C═O)— or a bond; B is —(CR$_2$)$_m$O—, —(CR$_2$CR$_2$O)$_m$—, or a bond; and each R is independently selected from the group consisting of hydrogen, alkyl, alkenyl, alkynyl, cycloalkyl, cycloakenyl, aryl and aralkyl.

In another aspect, the process may comprise the steps of:
a) polymerizing a resist mixture, while in contact with a mold having imprint forming patterns thereon, to thereby form an imprint structure comprising the polymerize organometallic compound, said resist mixture comprising at least one olefinic polymerizable compound and a polymerizable organometallic compound having at least one carboxylate of Formula 1:

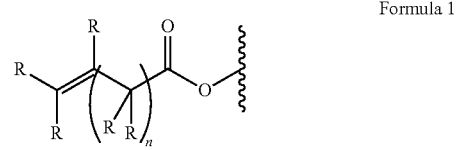

Formula 1 wherein n is 1-12; and each R is independently selected from the group consisting of hydrogen, alkyl, alkenyl, alkynyl, cycloalkyl, cycloakenyl, aryl, and aralkyl; or at least one acetoacetate of Formula 2:

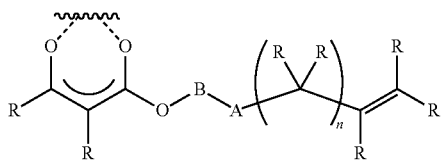

Formula 2 wherein m is 0-12; n is 0-12; A is —(C═O)— or a bond; B is —(CR$_2$)$_m$O—, —(CR$_2$CR$_2$O)$_m$—, or a bond; and each R is independently selected from the group consisting of hydrogen, alkyl, alkenyl, alkynyl, cycloalkyl, cycloakenyl, aryl, and aralkyl; and (b) heating said imprint structure to remove organic material and thereby form said patterned metal oxide structure.

The patterned metal oxide structure can be any metal oxide, such as metal oxides based on Group III to Group XII metals and Group XIII to Group XVI metalloids. The metal oxide may comprise at least two metals selected from the group consisting of Group III to Group XII metals and Group XIII to Group XVI metalloids. The at least two metals may be the same or different. The metal oxide may be selected from the group consisting of TiO$_2$, ZrO$_2$, Fe$_2$O$_3$, Nb$_2$O$_5$, and Ta$_2$O$_5$.

The patterned metal oxide structure may have features, such as gratings, lines pillars, dimples, cones, squares, dots, holes, columns, pillars, projections, trenches, etc, which are dimensioned in the range of about 20 nm to about 600 nm. The patterned metal oxide structure may have features with a dimension in the range of about 20 nm to about 400 nm, about 20 to about 200 nm, or about 30 nm to about 100 nm. The patterned metal oxide structure may have features below 100 nm in size.

The step of heating the imprint structure may comprise the step of subjecting the imprint structure to heat treatment for a period of time. Upon subjecting the imprint structure comprising a polymerized organometallic compound to heat treatment, a loss of organic material occurs as the organics react, e.g., combust, forming a patterned metal oxide structure. During heat treatment, a predominate amount of the organic material may be removed. In certain embodiments, heat treatment may remove about 60%, about 70%, about 80%, about 90%, about 95%, about 97%, about 98%, or substantially all of the organic material from the imprint structure thereby forming a patterned metal oxide. The degree of organic material that can be removed during heat treatment is dependent on a number of factors, such as the temperature, the length of time the imprint structure is subjected to heat treatment, and the physical-chemical properties of the imprint structure. Heat treatment can occur in the presence of oxygen or under an inert atmosphere, such as nitrogen or argon. In certain embodiments, the polymerized organometallic compound is subjected to heat treatment in the presence of oxygen. In certain embodiments, the heat treatment is a calcination process. The imprint structure may be heated at a temperature of about 30° C. to about 700° C., about 300° C. to about 600° C., about 400° C. to about 600° C., or about 450° C. to about 550° C. The step of beating the imprint structure may comprise the step of heat treating the imprint structure at a temperature of about 450° C. to about 500° C. In the examples below, a patterned titanium embedded resist is heated between 450-500° C. to produce patterned anatase structures attached to a substrate surface.

The imprint structure may be heat treated for about 1 minute to 5 hours, about 2 minutes to about hours, about 2 minutes to about 2 hours, or about 2 minutes to about 1 hour.

Upon heating, the dimensions of the imprint structure are reduced as organic material is removed. After heat treatment, the dimension of the metal oxide structure is reduced by at least 30% of the dimension of the imprint structure before heat treating. The dimension of the metal oxide structure after heating may be reduced by 30% to 80% of the dimension of the imprint structure before heat treatment. Advantageously, the heating step allows substantial reduction of the size of the imprint structure to occur.

The patterned metal oxide structure after heat treatment may have substantially the same aspect ratio as the imprint structure before the heating step. Advantageously, although the size of the patterned metal oxide is reduced, the aspect ratio of the imprint structure is retained.

An array of imprints may be disposed on a substrate. The array may be an ordered array of a series of rows and/or columns of patterned metal oxide structures being disposed on the substrate at an approximately equal distance from each other. In one embodiment, each imprint has a centre point defined along a central longitudinal axis and between the proximal and distal ends, and wherein the center point between adjacent imprints does not substantially change during the heating step. Advantageously, the overall pattern of the imprint array is kept substantially the same.

The imprint structure before the heating step may have a dimension in the micro-scale size range while the patterned metal oxide structure after the heating step may have a dimension in the nanoscale size range. Advantageously, this allows nano-sized patterned metal oxide structures to be produced from molds having imprint forming features of micro-sized dimensions.

In certain embodiments the process further comprises the step of irradiating a resist mixture in contact with a mold having an imprint forming surface thereon and removing said mold to form said imprint structure, wherein said resist mixture comprises a polymerizable organometallic compound and a radical initiator.

The resist mixture may comprise at least one polymerizable organometallic compound selected from the group consisting of an olefinic metal carboxylate (Formula 2), an olefinic metal acetoacetate (Formula 2), an olefinic metal alkoxide (Formula 3).

The polymerizable organometallic compound may comprise a metal complex containing olefins that are capable of participating in radical polymerization reactions with one or more olefinic polymerizable compounds and/or the polymerizable organometallic compound.

The polymerizable organometallic compound may comprise at least one metal selected from the group consisting of Group III to Group XII metals and Group XIII to Group XVI metalloids. The polymerizable organometallic compound may comprise at least two metals selected from the group consisting of Group III to Group XII metals and Group XIII to Group XVI metalloids. The at least two metals may be the same or different.

The polymerizable organometallic compound may comprise a metal selected from the group consisting of Sc, Ti, V, Cr, Mn, Fe, Co, Ni, Cu, Zn, Y, Zr, Nb, Mo, To, Ru, Rh, Pd, Ag, Cd, Hf, Ta, W, Re, Os, Ir, Pt, Au, Tc, La, Ce, Pr, Nd, Pm, Sm, Eu, Gd, Tb, Dy, Ho, Er, Tm, Yb, Lu, Ac, Th, Pa, U, Np, Pu, Am, Cm, Bk, Cf, Es, Fm, Md, No, Lr, Al, Ga, In, Tl, Si, Ge, Sn, Pb, As, Sb, Bi, Te, and Po. The polymerizable organometallic compound may comprise a metal selected from Sc, Ti, Fe, Ni, Cu, Zn, Zr, Tc, Ag, Cd, Hf, Pt, Au, Ga, In, Si, Ge, and Nd. The polymerizable organometallic compound may comprise a metal selected from the group consisting of Ag, Zn, Sc, Ti, Zr, Hf, Fe, Ni, Cu, Zn, Pt, Sn, Pd, Au, Ga, In, Ge, and Nb. The polymerizable organometallic compound may comprise a metal selected from the group consisting of Ti, Zr, Hf, Nb, Ta, Ag, Zn, Fe, Sn, Cu, Au, Pt, Pd, and Ni.

The polymerizable organometallic compound may comprise a metal having an oxidation state of +1, +2, +3, +4, +5, +6, +7, or +8. The polymerizable organometallic compound may comprise a metal in is most stable oxidation state. The polymerizable organometallic compound may comprise a metal selected from the group consisting of $Sc^{+3}$, $Ti^{+4}$, $V^{+5}$, $Cr^{+3}$, $Cr^{+6}$, $Mn^{+2}$, $Mn^{+4}$, $Mn^{+7}$, $Fe^{+2}$, $Fe^{+3}$, $Co^{+2}$, $Co^{+3}$, $Ni^{+2}$, $Ni^{+4}$, $Cu^{+1}$, $Cu^{+2}$, $Zn^{+2}$, $Y^{+3}$, $Zr^{+4}$, $Nb^{+5}$, $Mo^{+4}$, $Mo^{+6}$, $Tc^{+4}$, $Tc^{+7}$, $Ru^{+3}$, $Ru^{+4}$, $Rh^{+3}$, $Pd^{+2}$, $Pd^{+4}$, $Ag^{+1}$, $Cd^{+2}$, $Hf^{+4}$, $Ta^{+5}$, $W^{+4}$, $W^{+6}$, $Re^{+4}$, $Os^{+4}$, $Ir^{+3}$, $Ir^{+4}$, $Pt^{+2}$, $Pt^{+4}$, $Au^{+3}$, $Hg^{+1}$, $Hg^{+2}$, $La^{+3}$, $Ce^{+3}$, $Ce^{+4}$, $Pr^{+3}$, $Nd^{+3}$, $Pm^{+3}$, $Sm^{+3}$, $Eu^{+2}$, $Eu^{+3}$, $Gd^{+3}$, $Tb^{+3}$, $Dy^{+3}$, $Ho^{+3}$, $Er^{+3}$, $Tm^{+3}$, $Yb^{+3}$, $Lu^{+3}$, $Ac^{+3}$, $Th^{+4}$, $Pa^{+5}$, $U^{+6}$, $Np^{+5}$, $Pu^{+4}$, $Am^{+3}$, $Cm^{+3}$, $Bk^{+3}$, $Cf^{+3}$, $Es^{+3}$, $Fm^{+3}$, $Md^{+3}$, $No^{+2}$, $Lr^{+3}$, $Al^{+3}$, $Ga^{+3}$, $In^{+3}$, $Tl^{+3}$, $Si^{+4}$, $Ge^{+4}$, $Sn^{+4}$, $Pb^{+4}$, $Pb^{+2}$, $As^{+3}$, $As^{+5}$, $Sb^{+3}$, $Sb^{+5}$, $Bi^{+3}$, $Te^{+4}$, $Te^{+6}$, $Po^{+2}$, and $Po^{+4}$. The polymerizable organometallic compound may comprise a metal selected from the group consisting of $Sc^{+3}$, $Ti^{+4}$, $Fe^{+2}$, $Fe^{+3}$, $Ni^{+2}$, $Ni^{+4}$, $Cu^{+1}$, $Cu^{+2}$, $Zn^{+2}$, $Zr^{+4}$, $Tc^{+4}$, $Tc^{+7}$, $Ag^{+1}$, $Cd^{+2}$, $Hf^{+4}$, $Pd^{+2}$, $Pd^{+4}$, $Pt^{+2}$, $Pt^{+4}$, $Sn^{+4}$, $Au^{+3}$, $Ga^{+3}$, $In^{+3}$, $Si^{+4}$, $Ge^{+4}$, $Nb^{+3}$, and $Nd^{+3}$. The polymerizable organometallic compound may comprise a metal selected from the group consisting of $Sc^{+3}$, $Ti^{+4}$, $Zr^{+4}$, $Hf^{+4}$, $Fe^{+2}$, $Fe^{+2}$, $Ni^{+2}$, $Ni^{+4}$, $Cu^{+1}$, $Cu^{+2}$, $Zn^{+2}$, $Pt^{+4}$, $Sn^{+4}$, $Pd^{+2}$, $Pd^{+4}$, $Au^{+3}$, $Ga^{+3}$, $In^{+3}$, $Ge^{+4}$, and $Nb^{+3}$. The polymerizable organometallic compound may comprise a metal selected from the group consisting of $Ti^{+4}$, $Zr^{+4}$, $Hf^{+4}$, $Nb^{+3}$, $Ta^{+4}$, $Ta^{+5}$, $Fe^{+2}$, $Fe^{+3}$, $Sn^{+4}$, $Cu^{+1}$, $Cu^{+2}$, $Ni^{+2}$, and $Ni^{+4}$.

The polymerizable organometallic compound may be selected from the group consisting of an olefinic metal carboxylate, an olefinic metal alkoxide, and combinations thereof. The polymerizable organometallic compound may comprise one or more terminal olefins, one or more cis olefins, one or more trans olefins or combinations thereof.

Certain embodiments, polymerizable organometallic compound comprises at least one carboxylate of Formula 1:

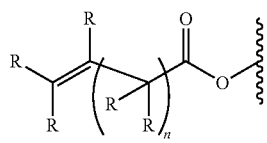

Formula 1 wherein n is 1-12; and each R is independently selected from the group consisting of hydrogen, alkyl, alkenyl, alkynyl, cycloalkyl, cycloakenyl, aryl, and aralkyl. n may be selected from the range of 1-6, 1-4, 1-2, or n may be 1. In one embodiment, n is 1 and each R is independently selected from the group consisting of hydrogen and alkyl. In another embodiment, n is 2 and each R is independently selected from the group consisting of hydrogen and alkyl. The carboxylate of Formula 1 may be a carboxylate selected from the group consisting of acrylate, methacrylate, 2-butenoate, 3-butenoate, 2-pentenoate, 3-pentenoate, 4-pentenoate, 2 hexenoate, 3-hexenoate, 4-hexenoate, and 5 hexenoate.

In certain embodiments, the polymerizable organometallic compound comprises at least one acetoacetate of Formula 2:

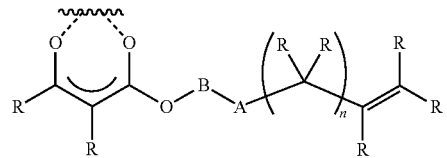

Formula 2 wherein m is 0-12; n is 0-12; A is —(C=O)— or a bond; B is —$(CR_2)_mO$—, —$(CR_2CR_2O)_m$—, or a bond; and each R is independently selected from the group consisting of hydrogen, alkyl, alkenyl, alkynyl, cycloalkyl, cycloakenyl, aryl, and aralkyl.

In certain embodiments, A is —(C=O)—; B is —$(CR_2)_mO$—; and m is 2-12. In certain embodiments, A is —(C=O)—; B is —$(CR_2)_mO$—; m is 2-6; and each R is independently selected from the group consisting of hydrogen and alkyl.

In certain embodiments, A is —(C=O)—; B is —$(CR_2CR_2O)_m$—; and m is 1-12. In certain embodiments, A is —(C=O)—; B is —$(CR_2CR_2O)_m$—; m as 1-4; and each R is independently selected from the group consisting of hydrogen and alkyl.

In certain embodiments, the acetoacetate of Formula 2 has the Formula 2a:

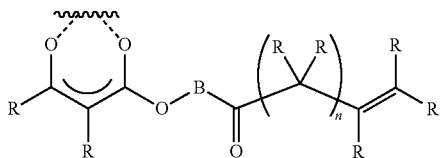

Formula 2a wherein m is 1-11; B is —$(CR_2)$ O— or —$(CR_2CR_2O)_m$—; and each R is independently selected from the group consisting of hydrogen, alkyl, alkenyl, alkynyl, cycloalkyl cycloakenyl, aryl, and aralkyl.

In certain embodiments, the acetoacetate has the Formula 2b:

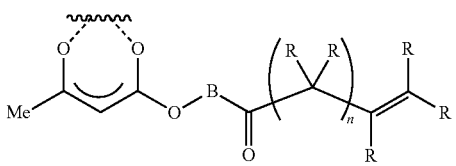

Formula 2b wherein m is 1-11; B is —$(CR_2)_mO$— or —$(CR_2CR_2O)_m$—; and each R is independently selected from the group consisting of hydrogen and alkyl.

In certain embodiments the acetoacetate has the Formula 2c:

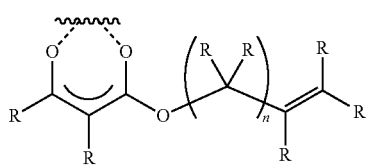

Formula 2c wherein n is 1-12 and each R is independently selected from the group consisting of hydrogen, alkyl, alkenyl, alkynyl, cycloalkyl, cycloakenyl, aryl, and aralkyl.

In certain embodiments the acetoacetate has the Formula 2d:

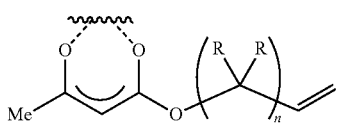

Formula 2d wherein n is 1-12 and each R is independently elected from the group consisting of hydrogen and alkyl.

In certain embodiments, the acetoacetate is selected from the group consisting of:

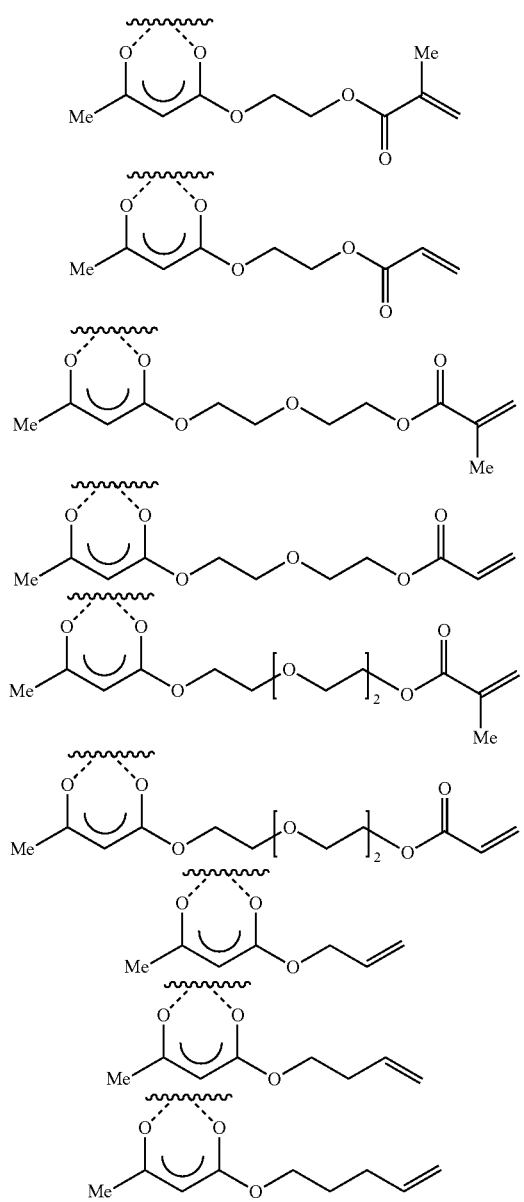

While the acetoacetate of Formula 2 is depicted herein as a bidentate ligand with bonding interactions between the metal and two oxygens, it should be noted that depending on the metal, the metal oxidation state, and the metal substitution that the acetoacetate can be monodentate, bidentate, tridentate, tetradentate, and combinations thereof.

In certain embodiments, the bonding interaction between the acetoacetate ligand and the metal can be represented by one or more of be following structures:

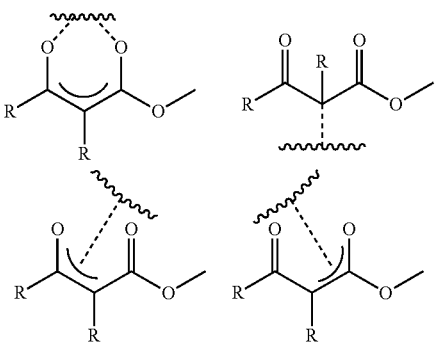

The polymerizable organometallic compound may comprise 1, 2, 3, 4, 5, 6, 7, 8, or 9 carboxylates of Formula 1 and/or acetoacetates of Formula 2. The polymerizable organometallic compound may comprise 2, 3, 4, 5, or 6 carboxylates of Formula 1 and/or acetoacetates of Formula 2. The polymerizable organometallic compound may comprise 2, 3, or 4 carboxylates of Formula 1 ad acetoacetates of Formula 2. The polymerizable organometallic compound may comprise 3 or 4 carboxylates of Formula 1 and/or acetoacetates of Formula 2. The polymerizable organometallic compound may comprise 3 carboxylates or Formula 1. The polymerizable organometallic compound may comprise carboxylates of Formula 1. The polymerizable organometallic compound may comprise 4 acetoacetates of Formula 2. The polymerizable organometallic compound may comprise 2 acetoacetates of Formula 2.

The polymerizable organometallic compound may be selected from the group consisting of titanium(IV) tetraacrylate, titanium(IV) tetramethacrylate, titanium(IV) tetra(3-butenoate), zirconium(IV) tetraacrylate, zirconium(IV) tetramethacrylate zirconium(IV) tetra(3-butenoate), iron(III) triacrylate, iron(III) trimethacrylate, iron(III) tri(3-butenoate), neodymium(III) triacrylate, neodymium(III) trimethacrylate, neodymium(III) tri(3-butenoate), tantalum (IV) pentaacrylate, tantalum(V) pentamethacrylate, tantalum (V) penta(3-buenoate), titanium(IV) tetra[(2-

(methacryloyloxy)ethyl acetoacetate)], titanium(IV)oxide bis[(2-(methacryloyloxy)ethyl acetoacetate)], zirconium(IV) tetra[(2-(methacryloyloxy)ethyl acetoacetate)], iron(III) tri [(2-(methacryloyloxy)ethyl acetoacetate)], neodymium(III) tri[(2-(methacryloyloxy)ethyl acetoacetate)], tantalum(V) penta[(2-(methacryloyloxy)ethyl acetoacetate)], titanium (IV) tetra(allyl acetoacetate), iron(III) tri(allyl acetoacetate), neodymium(III) tri(allyl acetoacetate), and tatalum(V) penta (allyl acetoacetate).

The polymerizable organometallic compound can be synthesized by a number of methods readily known to those skilled in art. In one method, the polymerizable organometallic compound can be prepared by displacing a labile ligand from a metal complex. For example, alkoxides and halides are readily displaced by reaction of a metal alkoxide or metal halide with, e.g., a carboxylic acid or acetoacetate under the appropriate conditions to prepare the polymerizable organometallic compound. By adjusting the molar ratio of metal salt starting material and the nucleophile polymerizable organometallic compound with varying numbers of olefinic ligands, e.g., carboxylates of Formula 1 and acetoacetates of Formula 2, can be prepared in the examples below, 4 equivalents of an unsaturated carboxylic acid are reacted with one equivalent of a titanium alkoxide species to form a tetracarboxylate titanium compound.

In certain embodiments, the polymerizable organometallic compound comprises at least one alkoxide of Formula 3:

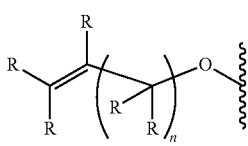

Formula 3 wherein n is 1-12; and each R is independently selected from the group consisting of hydrogen, alkyl, alkenyl, alkynyl, cycloalkyl, cycloakenyl, aryl, and aralkyl in certain embodiments, n is selected from the range of 1-6, 1-4, or 1-2. In one embodiment, n is 1 and each R is independently selected from the group consisting of hydrogen and alkyl. In another embodiments, n is 2 and each R is independently selected from the group consisting of hydrogen and alkyl. The alkoxide of Formula 3 may be selected from the group consisting of:

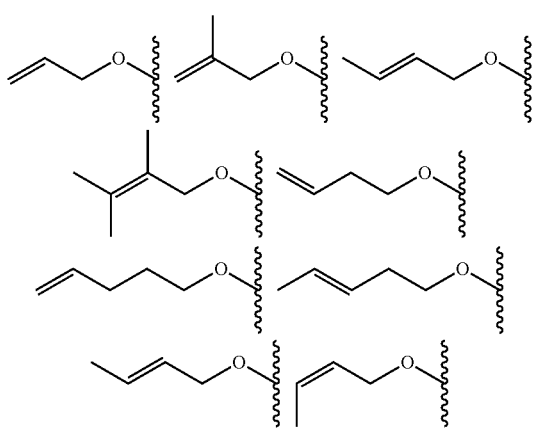

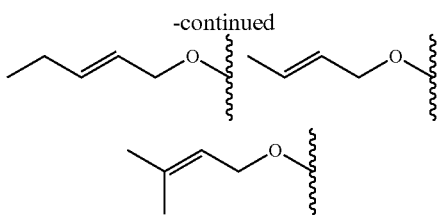

The polymerizable organometallic may comprise 1, 2, 3, 4, 5, 6, 7, 8, or 9 alkoxides of Formula 3. The polymerizable organometallic may comprise 2, 3, 4, 5, or 6 alkoxides of Formula 3. The polymerizable organometallic may comprise 2, 3, or 4 alkoxides of Formula 3. The polymerizable organometallic may comprise 3 or 4 alkoxides of Formula 3. The polymerizable organometallic may comprise 3 alkoxides of Formula 3. The polymerizable organometallic may comprise 4 alkoxides of Formula 3.

The polymerizable organometallic comprising an alkoxide of Formula 3 can be synthesized by a number of methods readily known to those skilled in art. In one method, the olefinic metal alkoxide is prepared by displacing a labile ligand from a metal complex. For example, halides are readily displaced by the reaction of a metal halide with an alcohol or alkoxide salt under the appropriate conditions to prepare the olefinic metal alkoxide. By adjusting the molar ratio of the metal salt starting material and the alcohol or alkoxide, olefinic metal alkoxides with varying numbers of olefinic alkoxides can be prepared.

The polymerizable organometallic compound may further comprise 1, 2, 3, 4, 5, 6, or 7 non-olefinic ligands selected from the group consisting of fluoride, chloride, bromide, iodide, hydroxide, oxide, cyanide, nitrate, nitrite, sulate, hydrogensulfate, thiosulfate, sulfite, hydrogensulfide, carbonate, hydrogencarbonate, chlorate, perchlorate, phosphate, hydrogenphosphate, phosphite, acetate, methoxide, ethoxide, propanoxide, and butanoxide. The organometallic compound may further comprise 1, 2, 3, or 4, pendant ligands selected from the group consisting of methoxide, ethoxide, propanoxide, and butanoxide.

The resist mixture may comprise at least one olefinic polymerizable compound capable of reacting under radical polymerization conditions with the polymerizable organometallic compound and/or with another equivalent of the olefinic polymerisable compound. The resist mixture may comprise 2, 3, 4, 5, 6, 7 or 8 olefinic polymerizable compounds. The resist mixture may comprise 2, 3, 4, or 5 olefinic polymerizable compounds. The resist mixture may comprise 2, 3, or 4 olefinic polymerizable compounds. The resist mixture may comprise 3 or 4 olefinic polymerizable compounds.

The olefinic polymerisable compound may be selected from the group consisting of a $C_2$-$C_{40}$ unsaturated optionally substituted hydrocarbon, a $C_2$-$C_{30}$ unsaturated optionally substituted hydrocarbon, a $C_2$-$C_{20}$ unsaturated optionally substituted hydrocarbon, a $C_2$-$C_{10}$ unsaturated optionally substituted hydrocarbon, and a $C_4$-$C_7$ unsaturated optionally substituted hydrocarbon.

The olefinic polymerizable compound may have 1, 2, 3, or 4 olefins capable of reacting with the polymerizable organometallic compound under radical conditions or with an olefin on another equivalent of the olefinic polymerizable compound. The olefinic polymerizable compound may have 1 or 2 olefins.

The olefinic polymerizable compound may be selected from the group consisting of acrylates, (moth) acrylates, fumarates and maleates, such as methyl(meth)acrylate, ethyl (meth)acrylate, n-propyl(meth)acrylate, isopropyl (meth)acrylate, n-butyl(meth)acrylate, iso-butyl(meth)acrylate, tert-butyl (meth)acrylate, pentyl(meth)acrylate, cyclopentyl (meth)acrylate, cyclohexyl(meth)acrylate, 2-propynyl(meth)acrylate, alkyl(meth)acrylate, vinyl(meth)acrylate and the corresponding acrylates, fumerates, and maleates. The acrylate, (meth)acrylate, fumerate, or maleate ester may be substituted with one or more fluorine atoms. The olefinic polymerizable compound may be a fluoroalkyl acrylate, (meth) acrylate, fumerate, or maleate. The olefinic polymerizable compound may be 3,3,4,4,5,5,6,6,7,7,8,8,9,9,10,10-heptadecafluorodecyl methacrylate or 3,3,4,4,5,5,6,6,7,7,8,8,9,10,10-heptadecafluorodecyl acrylate.

The olefinic polymerizable compound may be selected from monoesters and diesters of glycol and polyglycol acrylates, methacrylates, and vinyl ethers. The olefinic polymerizable compound may be selected from the group consisting of ethylene glycol diacrylate, ethylene glycol di(meth)acrylate, ethylene glycol divinyl ether and di(ethylene glycol) divinyl ether.

The olefinic polymerizable compound may be a vinyl ether or a vinyl carboxylate. The vinyl ether may be selected from the group consisting of alkyl vinyl ethers, cycloalkyl vinyl ethers, fluoroalkyl vinyl ethers, glycol vinyl ethers, di(ethylene glycol)vinyl ethers, and polyethylene glycol vinyl ethers. The vinyl ether may be selected from the group consisting of cyclohexylvinyl ether, cyclopentyl vinyl ether, ethyl vinyl ether, propyl vinyl ether, butyl vinyl ether, pentyl vinyl ether, hexyl vinyl ether, 2,2,2-trifluoroethyl vinyl ether, and di(ethylene glycol)divinyl ether. The vinyl carboxylate may be selected from vinyl acetate, vinyl propiolate, vinyl butenoates, vinyl pentencoates, and vinyl benzoate.

The resist mixture may be irradiated in the presence of a radical initiator by exposure to electromagnetic radiation in the presence of a photo-initiator.

The step of polymerizing the resist mixture may comprise irradiating the resist mixture. The irradiating step may comprise UV irradiating. The resist mixture may be irradiated with radiation, e.g., UV radiation, to polymerize the resist mixture in the presence of a photo-initiator. Any wavelength of UV radiation can be used to polymerize the resist mixture, such as from about 10 nm to about 400 nm, from about 130 nm to about 450 nm, from about 200 nm to about 450 nm, or from about 250 nm to about 450 nm.

In certain embodiments, the step of irradiating the resist mixture comprises irradiating the resist mixture with broadband UV-light.

The resist mixture may be irradiated with ultraviolet radiation from about 30 seconds to about 10 minute, from about 30 seconds to 5 minutes, from about 30 seconds to about 4 minutes, or from about 1 minute to about 3 minutes.

The photo-initiator may be selected from the group consisting of acetophenones, benzil compounds, benzoin compounds, benzophenones, cationic photo-initiators, and thioxanthones.

The photo-initiator may be an acetophenone selected from the group consisting of 2-benzyl-2-(dimethylamino)-4'-morpholinobutyrophenone, 3,6-bis(2-methyl-2-morpholinopropionyl)-9-octylcarbazole, 4'-tert-butyl-2,6'-dimethylacetophenone, 2,2-diethoxyacetophenone, 2,2-dimethoxy-2-phenylacetophenone, blended diphenyl(2,4,6-trimethylbenzoyl)phosphineoxide/2-hydroxy-2-methylpropiopenone, 4'-ethoxyacetophenone, 3 hydroxyacetophenone, 4'-hydroxyacetophenone, 1-hydroxy-cyclohexyl phenyl ketone, 2-hydroxy-4'-(2-hydroxyethoxy)-2-methylpropiophenone, 2-hydroxy-2-methylpropiophenone, 2-methyl-4'-(methylthio)-2-morpholinopropiophenone, 4'-phenoxyacetophenone, and combinations thereof.

The photo-initiator may be a bezil compound or a benzoin compound selected from the group consisting of benzoin, benzoin ethyl ether, benzoin methyl ether, 4,4'-dimethoxybenzoin, 4,4'-dimethoxybenzil, and combinations thereof.

The photo-initiator may be a benzophenone selected from the group consisting of benzophenone, benzophenone-3,3',4,4'-tetracarboxylic dianhydride, 4-benzoylbiphenyl, 4,4'-bis(diethylamino)benzophenone, 4,4'-bis[2-(1-propenyl)phenoxy]benzophenone, 4-(diethylamino)benzophenone, 4,4'-dihydroxybenzophenone, 4-(dimethylamino)benzophenone, 3,4-dimethylbenzophenone, 3-hydroxybenzophenone, 4-hydroxybenzophenone, 2-methyl benzophenone, 3-methylbenzophenone, 4-methylbenzophenone, methyl benzoylformate, 4,4'-bis(dimethylamino)benzophenone, and combinations thereof.

The photo-initiator may be a cationic photo-initiator selected from the group consisting of bis(4-tert-butylphenyl)iodonium perfluoro-1-butanesulfonate, bis(4-tert-butylphenyl)iodonium p-toluenesulfonate, bis(4-tert-butylphenyl)iodonium triflate, Boc-methoxyphenyldiphenylsulfonium triflate, (4-bromophenyl)diphenylsulfonium triflate, (tert-butoxycarbonylmethoxynaphthyl)-diphenylsulfonium triflate, (4-tert-butylphenyl)diphenylsulfonium triflate, diphenyliodonium 9,10-dimethoxyanthracene-2-sulfonate, diphenyliodonium hexa fluorophosphate, diphenyliodonium nitrate, diphenyliodonium perfluoro-1-butanesulfonate, diphenyliodonium p-toluenesulfonate, diphenyliodonium triflate, (4-fluorophenyl)diphenylsulfonium triflate, N-hydroxynaphthalimide triflate, N-hydroxy-5-norbornene-2,3-dicarboximide perfluoro-1-butanesulfonate, (4-iodophenyl)diphenylsulfonium triflate, (4-methoxyphenyl)diphenylsulfonium triflate, 2-(4-methoxystyryl)-4,6-bis(trichloromethyl)-1,3,5-triazine, (4-methylphenyl)diphenylsulfonium triflate, (4-methylthiophenyl)methyl phenyl sulfonium triflate, 1-naphthyl diphenylsulfonium triflate, (4-phenoxyphenyl)diphenylsulfonium triflate, (4-phenylthiophenyl)diphenylsulfonium triflate, triarylsulfonium hexafluoroantimonate salts, triarylsulfonium hexafluorophosphate salts, triphenylsulfonium perfluoro-1-butanesulfonate, triphenylsulfonium triflate, tris(4-tert-butylphenyl)sulfonium perfluoro-1-butanesulfonate, and tris(4-tert-butylphenyl)sulfonium triflate.

The photo-initiator may be a thioxanthone selected from the group consisting of 1-chloro-4-propoxy-9-thioxanthen-9-one, 2-chlorothioxanthen-9-one, 2,4-diethyl-9H-thioxanthen-9-one, isopropyl-9H-thioxanthen-9-one, 10-methylphenothiazine, thioxanthen-9-one, and combinations thereof.

The process may further comprise the step of depositing a resist mixture on a substrate surface. The process may further comprise the step of contacting the resist mixture with the mold.

The material of the substrate surface may be comprised of any organic material, such as a polymer, or an inorganic material, such as silicon. The substrate may be planar or non planar. Exemplary substrate materials include silicon, glass, quartz, mica, ceramics, polymers such as polyethylene, polypropylene, polyesters such as polyethylene terephthalate, polybutylene terephthalate, polyamides, fluoropolymers and polysulphone and metals such as gold, silver, copper. The substrate may be composed of a material selected from the group consisting of silicon, glass, metal, metal oxide silicon dioxide, silicon nitride, indium tin oxide, ceramic, sapphire, and combinations thereof.

The mold may have a defined surface or imprint forming patterns to create three-dimensional imprint structures during the contacting step. The three-dimensional imprint structures may be dimensioned in at least one of the microscale and the nanoscale. The mold may have a solid body with an array of conduits extending through the solid body. The mold may be made of any suitable material that is chemically inert and able to at least partially transmit electromagnetic radiation, such as glass and quartz. The mold may have an imprint forming surface provided thereon and may be patterned. Hence, the mold may have imprint forming patterns thereon. The patterns may comprise holes, columns, pillars, dimples, projections, gratings or trenches. The patterns may have defined heights, widths or lengths that are in the microscale and/or in the nanoscale. The patterns may be in a spaced apart relationship from each other. The patterns may be three-dimensional structures.

The patterns on the mold may comprise gratings and/or trenches. The gratings and/or trenches may extend along respective longitudinal axes of the mold. The width of the gratings and/or trenches may be in the microscale and/or nanoscale. When both gratings and trenches are present on the mold, the gratings and trenches may be placed parallel to each other. The patterns on the mold may also comprise line and space patterns. The width of the gratings and/or trenches may be independently selected from the group consisting of about 50 nm to about 50 microns, about 50 nm to about 30 microns, about 50 nm microns to about 20 microns, about 80 mm to about 10 microns, about 80 nm to about 5 microns, about 90 nm to about 1 microns, about 100 nm to about 500 nm, about 100 nm to about 400 nm and about 50 nm to about 250 nm. In one embodiment, the width of the gratings and corresponding channels may be about 10 microns. The grating formation may have a shape, when viewed in cross-section, selected from the group consisting of sinusoidal wave shape, square wave, trapezoidal shape, blazed shape and triangular shape.

The gratings and/or trenches may have an aspect ratio selected from the group consisting of about 0.1 to about 3.0, about 0.1 to about 2.5, about 0.1 to about 2.0, about 0.1 to about 1.5, about 0.1 to about 1.0, and about 0.1 to about 0.5.

The patterns on the mold may comprise columns and/or circular holes. The diameter of the columns and/or circular holes may be in the micro-scale. The patterns on the mold may also comprise pillars and/or dimples.

The diameter of the columns and/or circular holes may be independently selected from the group consisting of about 100 nm to about 10 microns, about 100 nm to about 8 microns, about 100 nm to about 6 microns, about 100 nm to about 4 microns, about 100 nm to about 2 microns, about 100 nm to about 10 microns, about 500 nm to about 1 microns, about 100 nut 500 nm, about 100 nm to about 400 nm and about 150 nm to about 250 nm.

The columns, pillars, dimples and/or circular holes may have an aspect ratio selected from the group consisting of about 0.1 to about 3.0, about 0.1 to about 2.5, about 0.1 to about 2.0, and about 0.1 to about 1.5.

The patterns may be formed on the mold by a method selected from the group consisting of photolithography, deep reactive ion etching, holographic lithography, e-beam lithography, ion-beam lithography and combinations thereof.

The mold surface can be pretreated with an agent that decreases the surface energy to help facilitate clean removal of the mold from the imprint structure after polymerization. The mold may be treated with a fluoroalkyl chlorosilane prior to the step of contacting the molds with the resist mixture. The mold surface may be pretreated with a compound selected from the group consisting of dichlorodimethyl silane, octadecyltrichlosilane, dodecyl trichlorosilane, perfluorodecyltrichorosilane, and alkanethiols. The mold surface may be pretreated with perfluorodecyltrichlorosilane.

Prior to imprinting the resist mixture, the substrate surface and mold can be cleaned. For example, the substrate surface can be cleaned with piranha solution at 140° C. for 2 hours, followed by washing with deionized water and blow driving by nitrogen stream. The substrate surface can then be placed in a drying oven to remove any remaining moisture on the substrate surface. The mold can be treated in oxygen plasma (100 RF, 200 torr) for 10 min. After plasma-treatment, the mold can be cleaned by piranha solution at 140° C. for 2 hours, followed by rinsing with deionized water and blow drying by nitrogen stream.

The process may comprise the step of depositing the resist mixture on the substrate surface. The depositing step may comprise the step of drop dispensing. The depositing step may comprise the step of spin coating. When the resist mixture is drop dispensed, the volume of the resist mixture dispensed can vary by any amount, e.g., from between 1 μL and 20 μL. A resist material comprising an polymerizable organometallic compound, e.g., a metal acrylate or metal methacrylate, such as titanium (IV) tetraacrylate or titanium (IV) tetramethacrylate, may be deposited by spin coating the resist material on the substrate surface. A resist material comprising a metal 3-butenoate, such as titanium (IV) tetra(3-butenoate), may be deposited by spin coating or drop dispensing on the substrate surface.

After the resist mixture has been deposited on the substrate surface, the mold can be brought into contact with the resist mixture surface at a given pressure. The pressure with which the mold is brought in contact with the resist mixture will depend on a number of factors, such as the viscosity of the resist mixture and the size of the imprint features, but generally a force between 1N and 10N will be applied to the mold while in contact with the resist mixture. The mold is allowed to remain in contact with the resist mixture until the resist mixture has substantially filled all of the imprint features or patterns on the mold.

The viscosity of the resist mixture varies depending on the composition of the mixture, but generally can be between 1 mPas and 10 mPas, and can be as high as 20 mPas depending on the metal content. Hence, the viscosity can range from about 11 mPas to about 2 mPas.

The resist mixture can comprise between about 95% to about 99% by weight of the polymerizable organometallic compound and about 1% to about 5% by weight of the radical initiator. The resist mixture may further comprise a polymerizable olefin compound. In such embodiments, the polymerizable organometallic compound is present between about 30% to about 70%, about 30% to about 60%, about 30% to about 50%, or about 40% to about 50% by weight of the resist mixture. The polymerizable olefinic compound can be present in about 30% to about 70% about 30% to about, about 30% to about 60%, about 30% to about 50%, or about 40% to about 50% by weight of the resist mixture. The resist mixture may comprise about 30-60% by weight of the polymerizable organometallic compound, about 35-65% by weight of at least one polymerizable olefinic compound, and about 1-5% by weight of the radical initiator.

The processes disclosed herein are not limited to any type of lithography process and are generally applicable in e.g., flash imprint lithography, step flash imprint lithography and thermal imprint lithography process.

The process can be used for large patterns that require a step and repeat technique or step and flash imprint lithography (S-FIL). In such S-FIL, the resist mixture may be deposited on to a desired area of the substrate surface, e.g., by drop dispensing or by spin coating. The surface treated transparent mold bearing patterned relief structures can be aligned over the resist mixture. The mold can then be lowered into contact with the resist mixture, thereby displacing the resist mixture in order to fill up the voids between the imprint patterns and trapping the resist mixture in the imprint patterns irradiation with UV light through the side of the mold that is not in contact with the resist mixture cures the resist mixture to form an imprint structure. The mold is then separated from the imprint structure leaving an imprint structure (that is complementary to the imprint patterns on the mold). A short halogen etch can be used to clear any remaining thin webs of undisplaced resist material. The above process can be repeated on a different area of the substrate in order to form imprint structures throughout the substrate surface.

BRIEF DESCRIPTION OF DRAWINGS

The accompanying drawings illustrate a disclosed embodiment and serves to explain the principles of the disclosed embodiment. It is to be understood, however, that the drawings are designed for purposes of illustration only, and not as a definition of the limits of the invention.

FIGS. 4(a) and 4(b) are SEM images (30 k magnification) of 100 nm imprinted lines, and the imprint structures displaying significant shrinkage to 30 nm after: heat treatment, respectively. FIG. 4(c) and FIG. 4(d) are SEM images (30 k and 50 k magnification, respectively) of 100 nm imprinted pillars, and the imprint structures displaying significant shrinkage to 60 nm after heat treatment, respectively.

DETAILED DESCRIPTION OF DRAWINGS

Figure 1:
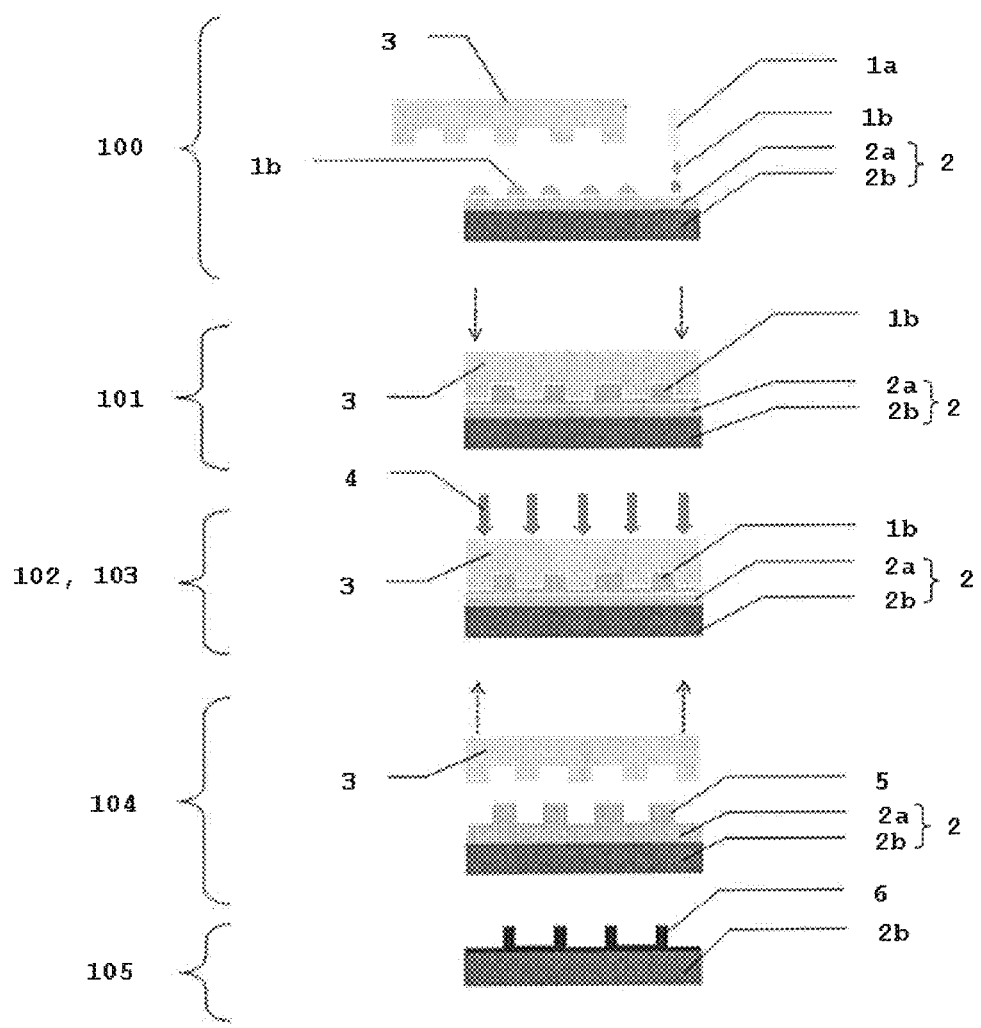
FIG. 1 is a schematic diagram representing the overall process of developing patterned metal oxide nanostructures.

FIG. 1 is a schematic diagram representing the overall process of developing patterned metal oxide nanostructures. The initial dispensing step 100 involves the deposition of a resist mixture 1b from a dispensing tip 1a onto a substrate material 2. The substrate material 2 consists of a planarizing layer 2a on a silicon wafer 2b.

A subsequent mold-substrate contacting step 101 occurs where a transparent mold 3 is brought into contact under pressure with the resist mixture 1b. The patterns of the mold 3 are consequently filled with the resist mixture 1b. A curing step 101 is then carried out, where UV rays 4 are applied through the mold 3 onto the deposited resist mixture 1b, causing it to solidify in a polymerizing step 103.

A mold removing step 104 is then carried out. Accordingly, the mold 3 is removed, leaving imprinted nanostructures 5 on the substrate material 2. The imprinted nanostructures 5 undergo a heat treating step 105 an a suitable temperature to enable the formation of the patterned metal oxide nanostructures 6, which are the oxide form of the imprinted nanostructures 5.

EXAMPLES

Example 1

Preparation of Formulation for Use in S-FIL

Titanium-vinyl monomer, possessing a terminal vinyl group, was synthesized by mixing titanium n-ethoxide (Stream Chemicals) and 3-butenoic acid (Sigma Aldrich) in a molar ratio of 1:4, Ethylene glycol diacrylate (Sigma Aldrich) and isobutyl acrylate (Sigma Aldrich) were added to the resultant reddish brown solution in various ratios. To this 1-5 wt % of a photoinitiator (e.g., 2-hydroxy-2-methyl-propiophenone from Sigma Aldrich) and 1-wt % of a fluorinated monomer (eg. 3,3,4,4,5,6,6,7,7,8,8,9,9,10,10,10-heptadecafluorodecyl methacrylate from Sigma Aldrich) were added. The resulting titanium vinyl solution was termed "TiVi resist". This overall formulation was used in S-FIL after a partial removal of the ethanol present in the resist was carried out by subjecting the resist to a vacuum drying process

Example 2

Preparation of $TiO_2$ Nanostructures Through S-FIL

Firstly, silicon substrates are cleaned with piranha solution at 140° C. for 2 hours, followed by washing with deionized water and blow drying by a nitrogen stream. The substrates are placed in a drying oven to remove any remaining moisture on the surface. The dimensions of the silicon substrates are between 50.8 mm and 203.2 mm. The silicon substrates were either directly utilized, or used with a 2 nm thick adhesion promoting coating.

Secondly, the molds (quartz molds with treated silane surfaces) are treated in oxygen plasma (100 RF, 200 torr) for 10 min, After the plasma-treatment, the molds are cleaned by piranha solution at 140° C. for 2 hours, followed by rinsing with deionized water and blow drying by a nitrogen stream. After drying, the molds were treated to have a self-assembled monolayer (SAM) [or multilayer] of per fluorodecyltrichlorosilane (FDTS) using a SAM coater. The silanization treatment helped to reduce the surface energy of the mold. This in turn ensures that a clean mold-removal process may be achieved. The molds contained various imprint forming surfaces such as lines, pillars, dimples, etc. with dimensions in a range of between about 50 nm and 500 nm.

As per FIG. 1, the initial dispensing step 100 consisted of depositing the resist material 1b from a dispensing tip 1a onto a substrate material 2 (e.g. quartz, glass, ceramic, or Indium-Tin-Oxide glass etc.).

A subsequent mold/substrate contacting step 101 was then carried out, where a transparent mold 3 was brought into contact under pressure with the resist material 1b. The patterns of the mold 3 were consequently filled with the resist mixture 1b, which is typically a mixture of various chemical compounds, including a polymer. A curing step 101 was then carried out, where UV rays 4 were applied through the mold 3 onto the deposited resist material 1b, causing it to solidify in a polymerizing step 103.

A mold removing step 104 was then carried out. Accordingly, the mold 3 was removed carefully, leaving the imprinted nanostructures 5 on the substrate material 2. The imprinted nanostructures 5 then underwent a heat treating step 105 at a suitable temperature (e.g. above 400° C.) to enable the formation of patterned metal oxide nanostructures 6.

The imprinting was carried out using an imprinting machine (Imprio 100, Molecular Imprints Inc., Austin, Tex., USA). With reference to FIG. 1, the following were carried out in the overall process. The TiVi resist mixture 1b was drop dispensed on to the desired fields followed by imprinting with a quartz mold 3. The volume of the resist mixture 1b dispensed varied between 1 μL and 20 μL depending on the field size. The imprinting force used was between 1 N and 10 N. The resist 1b was allowed to fill inside the mold patterns up to 120 s before being exposed to UV rays 4, in order to allow complete filling. The resist 1b was exposed for up to 120 s to cure the resist 1b fully, after which removal of the mold 3 gave rise to the imprinted structures.

An imprinting yield of ~95% was observed after mold-removal was carried out. Any defects may be eliminated by using another newly fabricated mold with a good anti-sticking layer on it and further process optimization. To convert the imprinted structures to the metal oxide form 6, or $TiO_2$, the imprinted structures were subjected a heat treating step 105 at temperatures in the range of about 400-700° C. in a furnace in air. In some instances, to convert the imprinted structures to the metal oxide form 6, or $TiO_2$, the imprinted structures were subjected to a heat treating step 105 from a temperature of 400° C. to 700° C. at a heating rate of 10° C./min. In some instances, the imprinted structures are heat treated at 450° C. for 1 hour to form the patterned metal oxide structure. This results in volume shrinkage and the formation of $TiO_2$.

Example 3

Characterization of Resist

The resist was characterized through thermal analyses and Fourier Transform Infrared (FT-IR) spectroscopy. Results from the thermal gravimetric analysis (TGA, TA Instruments Q100, USA) and scanning calorimetric analysis are shown FIGS. 2a and 2b, respectively.

Figure 2:
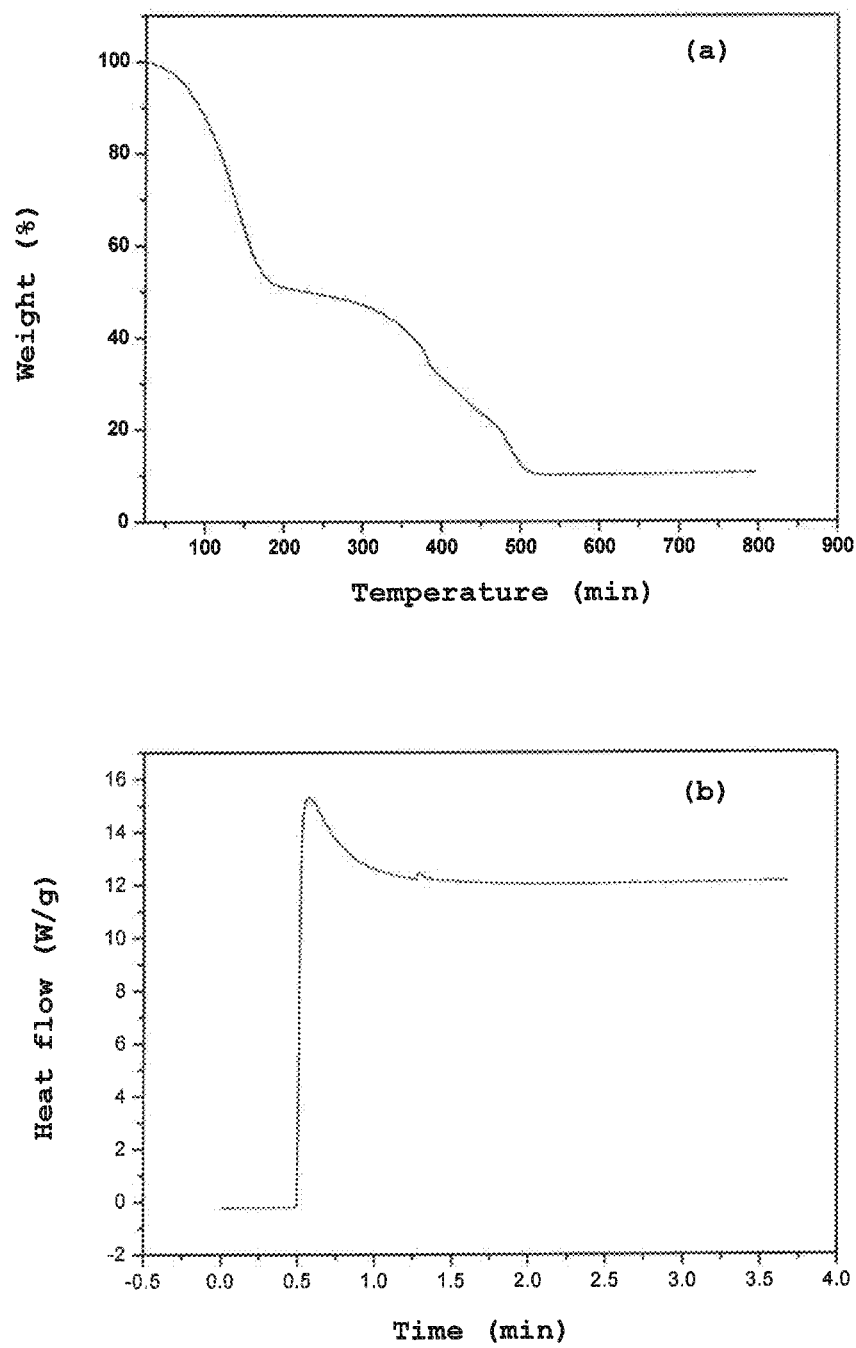
FIG. 2(a) depicts the thermogravimetric analysis of UV-cured titanium vinyl (TiVi) resist mixture.
FIG. 2(b) shows the photodifferential digital scanning calorimetric analysis of the TiVi resist mixture.

The photo-polymerized $TiO_2$ resist was subjected to thermogravimetric analysis (TGA) in order to understand its mass loss behavior. The TGA shows two distinct regions of almost equal mass loss: a loss between 25° C. and 180° C., which is most likely due to the decomposition of the allyl-functionalized titanium complex, and a further loss between 200° C. and 500° C. resulting from the loss of organic material from the resist, finally leading to 10.6% oxide residue (FIG. 2a). This is in good agreement with the calculated value of ~10 wt %. Photo-DSC studies of the $TiO_2$ resist shows that it takes about 45 seconds to completely cure the resist in UV radiation (FIG. 2b). The allyl-functionalized titanium complex can be a highly light absorbing complex (e.g., dark brown color), and hence there is a loss of UV radiation due to absorption by the complex in the $TiO_2$ resist.

Figure 3:
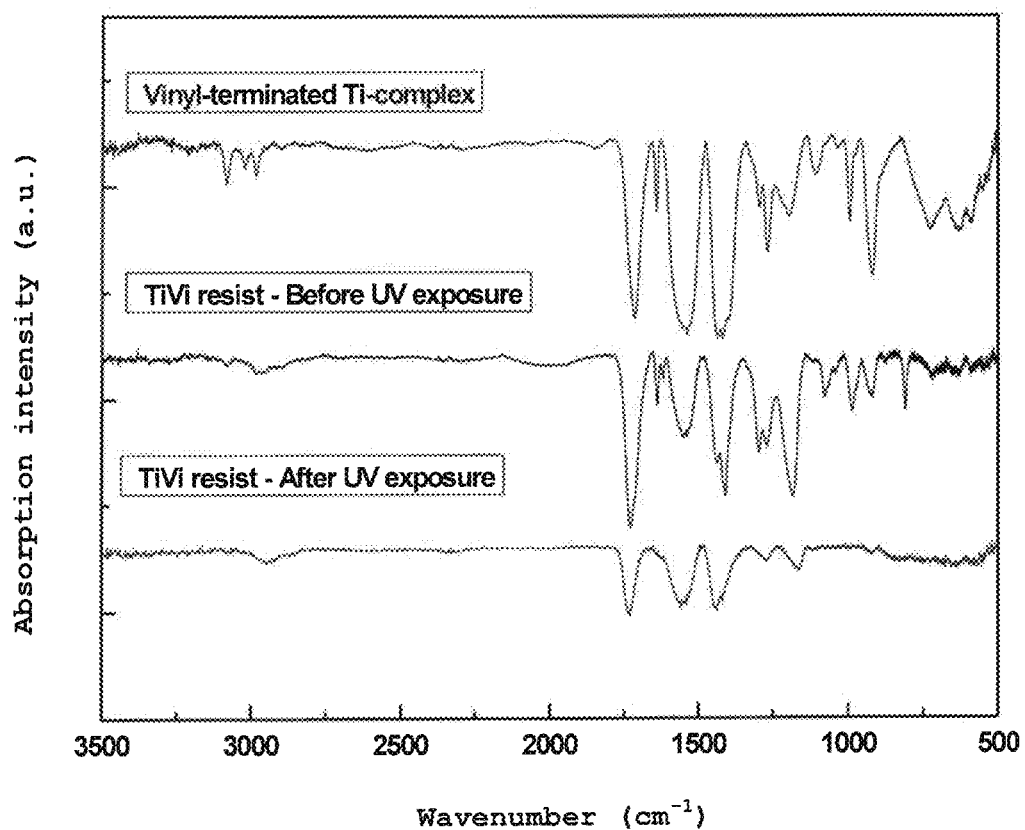
FIG. 3 shows the infrared analysis of the vinyl-terminated titanium complex, TiVi resist mixture before UV exposure and the mixture after UV exposure.

FT-IR spectroscopy showed the infrared (IR) absorbance band between 1600 and 1680 $cm^{-1}$ (FIG. 3) Upon UV light irradiation, the double bond intensities were greatly diminished showing the occurrence of polymerization in this system. The polymerization resulted in a hardening of the resist, allowing the containment of the metallic element within the polymeric network and enabling the conversion of the resultant structure to $TiO_2$ by a further heat-treatment process.

Example 4

Characterization of the $TiO_2$ Nanostructures Developed

Figure 4:
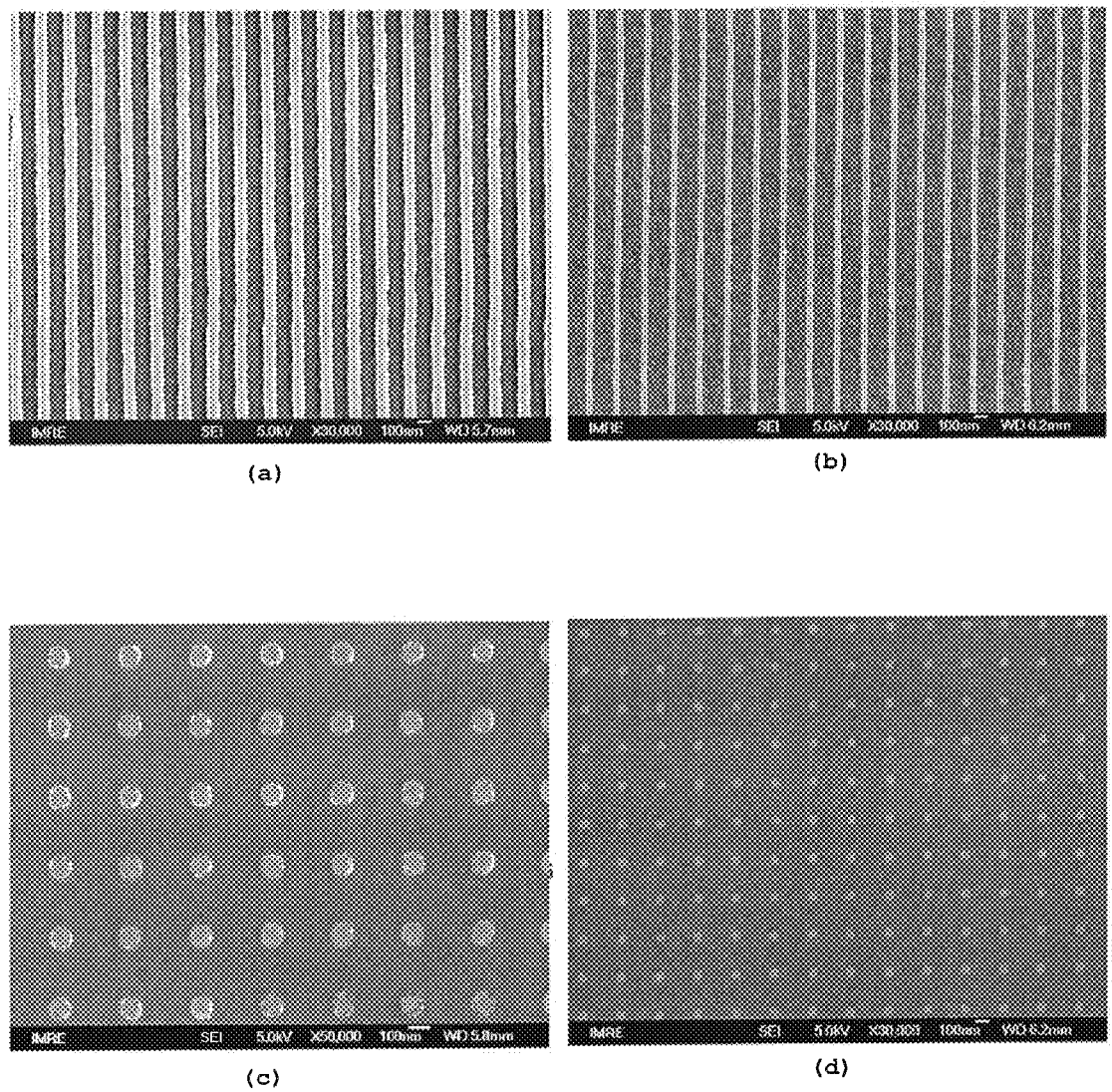
FIG. 4 shows Scanning Electron Microscope (SEM) images of imprinted structures on TiVi resist films.

The nanostructures of both pre- and post-heat treatment in Example 2 were visually characterized using Scanning Electron microscopy (SEM). FIGS. 4(a) and 4(b) respectively show the imprinted line and pillar nanostructures before the heat treatment process. FIGS. 4(c) and 4(d) respectively depict the nanostructures from FIGS. 4(a) and 4(b) after undergoing heat treatment. From the visual comparison of the nanostructures in the micrographs, it is observed that the nanostructures shrank after the heat treatment.

Figure 5:
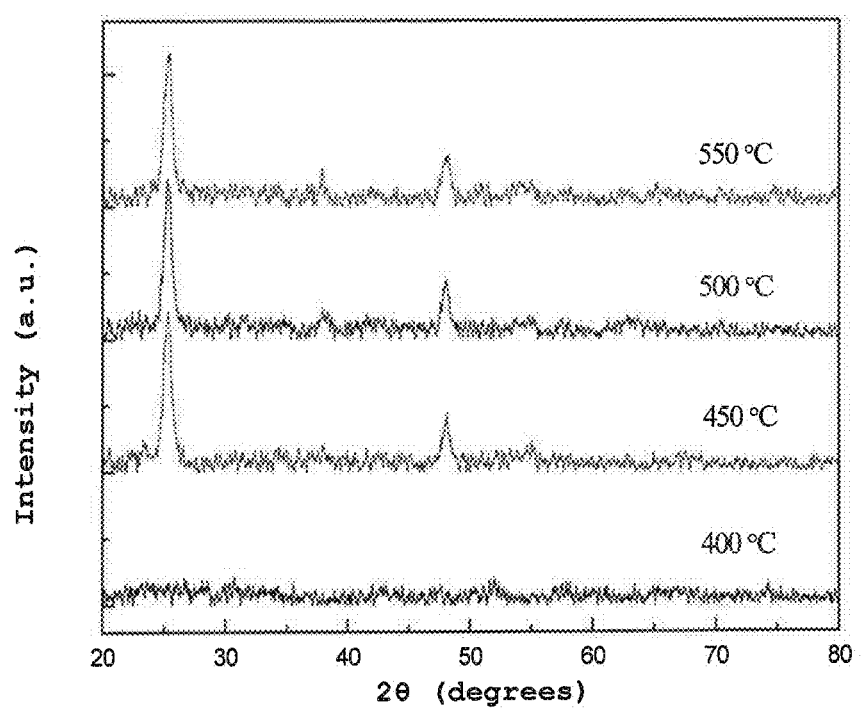
FIG. 5 shows the X-Ray diffractograms of imprinted structures after undergoing heat treatment at 400° C. 450° C. and 550° C.

X-ray diffraction (XRD) studies were also carried out on the heat-treated thin film formed with TiVi resist. The results from the XRD studies are shown in FIG. 5. It was found that anatase $TiO_2$ was formed when the heat-treatment was carried out in the range of about 450° C. to 550° C.

Furthermore, in using a two probe measurement, the electrical resistivity of the $TiO_2$ thin film was measured and found to be $2.3 \times 10^2$ Ωcm. This is in good agreement with commonly reported values of $TiO_2$ thin films, which is generally in the range of $10^2$ to $10^5$ Ωcm. The refractive index ($\eta$) of the anatase $TiO_2$ thin film was found to be 2.2±0.02. This value is very close to the reported value ($\eta$=2.3), suggesting the desirable optical characteristics of the material.

The modulus and hardness of the anatase $TiO_2$ thin film prepared at 450° C. and 550° C. were analyzed using the Atomic Force Microscopy (AFM, Agilent Nanoindenter G200 with DCM II, USA) nanoindentation method. The load was applied at a constant strain rate of 0.05 $s^{-1}$ until the depth reached was 200 nm. The modulus and hardness data were extracted from a depth range of 8-10 nm. It was found that the film formed at 450° C. possessed a modulus and hardness of 87.2±7.9 GPa and 4.51±0.76 GPa, respectively. These values of the film formed at 550° C. were found to be slightly increased to 96.2±11.9 GPa and 5.56±1.06 GPa, respectively. These values are in line with values suggested in the literature, and suggested the presence of a $TiO_2$ thin film with excellent mechanical strength.

Figure 6:
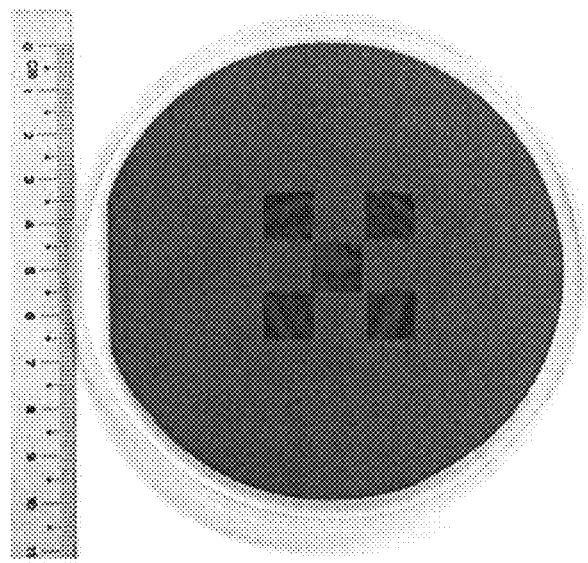
FIG. 6 shows a digital photograph image of a 5 field step and flash imprint using TiVi resist mixture on a 4 inch (102 mm) silicon wafer.

An Imprio 100 (Molecular imprints, Inc., USA) was used to pattern the $TiO_2$ resist in two steps. First, the resist was deposited on a silicon wafer by direct drop dispensing. The volume of drops was locally adjusted according to the pattern to be imprinted. After dispensing, the template containing 100 nm gratings (aspect ratio=1) was pressed into the liquid monomer and held for 120 s at a pressure of 500 mbar to fill all of the features. Second, the imprint material was photo-polymerized by broadband UV-light irradiation through the transparent template for 120 s, followed by demolding. The demolding forces were found to be in the range 5-10 N. This process was stepped and repeated five times. A digital photoimage depicting the imprinted patterns at a microscale is shown in FIG. 6. The obtained yield was estimated optically to be >95%.

APPLICATIONS

Among the many forms of lithography used for the development of nanostructures, a combination of factors gives S-FIL an inherent advantage in its potential for fine layer to layer alignment, which is necessary for the fabrication of multilayer devices.

S-FIL uses a rigid, optically transparent mold to imprint features at relatively low constant temperature (e.g. room temperature) and applied pressures (generally <6.9 KPa). Thermal distortions caused by differential thermal expansion are not an issue in S-FIL since the mold and substrate are not heated, unlike in thermal imprinting lithography. Furthermore, the low printing pressure of SI-FIL allows imprint in on brittle substrates, and reduces distortion caused by flexural deformations of the mold or substrate.

The metal-containing resist formulation of the present disclosure is suitable to be used in S-FIL, enabling efficient, high-throughput direct nanoimprinting. Also, the feature size of the imprinted structures is decreased upon a heat treatment process which converts the as-used resist formulation into a metal oxide product, which gives rise to smaller feature sizes than the as-imprinted structures. In this regard, the alignment accuracy in S-FIL may be as high as ±10 nm 3σ). Aligned nanostructures of such accuracy may be used in the development of gas sensors, biosensors, micro/nanoelectromechanical systems (MEMs or NEMs), and electrochromic displays.

Further to this, the high shrinkage offered by the currently disclosed method results in ultra-thin residual layers that can be removed by a simple de-scumming process. This is advantageous for nanoimprinting, as the residual layer is often undesirable, especially for pattern transfers to substrates (in which the imprinted oxides would act as a hard mask). In this regard, the resist formulation can be tuned to produce residual layers less than 50 nm, which, after shrinkage, results in features of less than 10 nm. This could have significant commercial potential because advantageously, shrinkage allows patterning on a larger scale with a less expensive mold. Such access to the formation of features below 40 nm is not technically available to other immersion photolithography tools, and only very slow beam writing techniques could compete.

The currently disclosed method can also be used for direct texturing of a functional oxide surface. For example, direct patterning of indium-tin-oxide (ITO) substrates may be carried out in the development of electrodes for light emitting diodes (LEDs), organic LEDs, solar cells, etc. In addition, the direct patterning of light extraction structures or the development of photonic crystals without the use of any high-vacuum, etching or chemical development steps may also be possible via the use of the disclosed method and their embodiments.

It will be apparent that various other modifications and adaptations of the invention will be apparent to the person skilled in the art after reading the foregoing disclosure without departing from the spirit and scope of the invention and it is intended that all such modifications and adaptations come within the scope of the appended claims.

The invention claimed is:

1. A process for making a patterned metal oxide structure comprising the steps of:
   (a) polymerizing a resist mixture, while in contact with a mold having imprint forming patterns thereon, to thereby form an imprint structure comprising a polymerized organometallic compound, said resist mixture comprising at least one olefinic polymerizable compound and a polymerizable organometallic compound having at least one carboxylate of Formula 1:

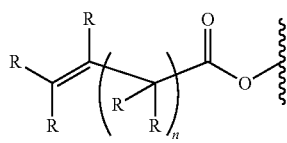

Formula 1 wherein
   n is 1-12; and
   each R is independently selected from the group consisting of hydrogen, alkyl, alkenyl, alkynyl, cycloalkyl, cycloakenyl, aryl, and aralkyl; and (b) heating said imprint structure to remove organic material and thereby form said patterned metal oxide structure.

2. The process of claim 1, wherein said polymerizing said resist mixture comprises irradiating said resist mixture.

3. The process of claim 2, wherein said irradiating comprises UV irradiating.

4. The process of claim 1, wherein said resist mixture further comprises a radical initiator.

5. The process of claim 4, wherein said radical initiator is a photo-initiator.

6. The process of claim 5, wherein said photo-initiator is selected from the group consisting of benzoins, benzils, benzophenones, acetophenones, and diaryl iodonium salts.

7. The process of claim 1, further comprising the step of depositing said resist mixture on a substrate surface.

8. The process of claim 7, wherein said depositing step comprises the step of drop dispensing.

9. The process of claim 1, wherein said heating step is undertaken at a temperature of at least 400° C.

10. The process of claim 1, wherein said olefinic polymerizable compound decreases the viscosity of the resist mixture.

11. The process of claim 10, wherein said viscosity of said resist mixture is in the range of 1 mPas to 20 mPas.

12. The process of claim 1, wherein said organometallic compound comprises a metal selected from the group consisting of Group IV metals, Group V metals, Group VIII metals, Group X metals, Group XI metals, and Group XII metals of the Periodic Table of Elements.

13. The process of claim 1, wherein the metal oxide present in said patterned metal oxide structure is selected from the group consisting of $TiO_2$, $ZrO_2$, $Fe_2O_3$, $Nb_2O_5$, and $Ta_2O_5$.

14. The process of claim 1, wherein said olefinic polymerizable compound is selected from the group consisting of alkyl acrylates, alkyl methacrylates, fluoroalkyl acrylates, fluoroalkyl methacrylates, ethylene glycol diacrylate, polyethylene glycol diacrylates, ethylene glycol dimethyacrylate, polyethylene glycol dimethacrylates, alkyl vinyl ethers, and fluoroalkyl vinyl ethers.

15. The process of claim 1, wherein said polymerizable organometallic compound is selected from the group consisting of titanium(IV) tetra(3-butenoate), zirconium(IV) tetra(3-butenoate), iron(III) tri(3-butenoate), neodymium(III) tri(3-butenoate), tantalum (V)penta(3-butenoate).

16. The process of claim 1, wherein said patterned metal oxide structure has features on the nanometer or micrometer scale.

17. The process of claim 1, wherein said resist mixture comprises 30-60% by weight of said polymerizable organometallic compound, 35-65% by weight of at least one polymerizable olefinic compound, and about 1-5% by weight of said radical initiator.

18. A process for forming a plurality of patterned metal oxide structures comprising the steps of:
   (a) polymerizing a resist mixture, while in contact with a mold having imprint forming patterns thereon, to thereby form an imprint structure comprising a polymerized organometallic compound on a first area of a substrate, said resist mixture comprising at least one olefinic polymerizable compound and a polymerizable organometallic compound having at least one carboxylate of Formula 1:

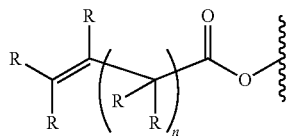

Formula 1 wherein n is 1-12; and each R is independently selected from the group consisting of hydrogen, alkyl, alkenyl, alkynyl, cycloalkyl, cycloakenyl, aryl, and aralkyl;

(b) heating said imprint structure on said first area to remove organic material and thereby form said patterned metal oxide structure on said first area; and (c) repeating steps (a) and (b) on a second area of said substrate in order to form said plurality of patterned metal oxide structures throughout the substrate.

* * * * *